United States Patent
Buhl et al.

(10) Patent No.: US 10,310,490 B2
(45) Date of Patent: Jun. 4, 2019

(54) METHOD AND APPARATUS OF EVALUATING A SEMICONDUCTOR MANUFACTURING PROCESS

(71) Applicant: Qoniac GmbH, Dresden (DE)

(72) Inventors: Stefan Buhl, Dresdent (DE); Martin Rößiger, Erlangen (DE); Boris Habets, Dresden (DE)

(73) Assignee: Qoniac GmbH, Dresden (DE)

( * ) Notice: Subject to any disclaimer, the term of this patent is extended or adjusted under 35 U.S.C. 154(b) by 0 days.

(21) Appl. No.: 15/011,962

(22) Filed: Feb. 1, 2016

(65) Prior Publication Data

US 2017/0221741 A1 Aug. 3, 2017

(51) Int. Cl.
| | | |
|---|---|---|
| G03B 27/42 | (2006.01) | |
| G05B 19/418 | (2006.01) | |
| H01L 21/66 | (2006.01) | |
| H01L 21/67 | (2006.01) | |

(52) U.S. Cl.
CPC ....... *G05B 19/418* (2013.01); *G05B 19/4184* (2013.01); *H01L 21/67276* (2013.01); *H01L 22/26* (2013.01); *G05B 2219/45031* (2013.01); *Y02P 90/14* (2015.11)

(58) Field of Classification Search
CPC ... H01L 22/20; H01L 22/12; H01L 21/67253; H01L 21/78; H01L 21/0274; H01L 2224/11; H01L 2224/759; H01L 51/56; H01L 21/561; H01L 2224/279; H01L 22/10; H01L 22/30; H01L 2224/03; H01L 27/1259
See application file for complete search history.

(56) References Cited

U.S. PATENT DOCUMENTS

| | | | |
|---|---|---|---|
| 5,866,437 A | 2/1999 | Chen et al. | |
| 6,587,744 B1* | 7/2003 | Stoddard | G05B 19/41885 438/14 |
| 7,076,320 B1* | 7/2006 | Phan | H01L 21/67253 356/394 |
| 7,646,476 B2 | 1/2010 | Huet et al. | |
| 8,396,583 B2 | 3/2013 | Tsai et al. | |
| 2008/0143985 A1* | 6/2008 | Mast | G03F 7/70525 355/53 |
| 2011/0238198 A1 | 9/2011 | Tsai et al. | |

* cited by examiner

*Primary Examiner* — Mesfin T Asfaw
(74) *Attorney, Agent, or Firm* — 24IP Law Group USA, PLLC (57) ABSTRACT

A method and apparatus for evaluating and controlling a semiconductor manufacturing process having a plurality of process steps in a process flow is described. The method comprises retrieving measurements of process step parameters from a process measurement database. The process step parameters comprise at least one of process step measurement data, process step context data or process step control data. The process step parameters are subsequently associated with one or more of the process steps.

10 Claims, 3 Drawing Sheets

Process Flow

METHOD AND APPARATUS OF EVALUATING A SEMICONDUCTOR MANUFACTURING PROCESS

CROSS-REFERENCE TO RELATED APPLICATIONS

None

BACKGROUND OF THE INVENTION

Field of the Invention

The field of the present application relates in general to a method of evaluating and controlling a semiconductor manufacturing process of a semiconductor chip having a plurality of microelectronic circuits on a semiconductor wafer and also to an apparatus for the evaluation of the semiconductor manufacturing process utilising the process flow of the semiconductor manufacturing process.

Brief Description of the Related Art

It will be appreciated that the term "semiconductor wafer" as used in this disclosure is intended to imply wafers used in the manufacture of all types of semiconductor devices, including, but not limited to, microelectronic circuits, such as memory devices, ASICS, logic circuits such as controllers or microprocessors, etc., liquid crystal panels, and photovoltaic devices.

The term "process flow" as used in in this disclosure means a series of process steps (and/or branching paths, which could also re-join each other or the series of process steps) in the semiconductor manufacturing process.

Current trends in the manufacturing of semiconductor devices by processing of the semiconductor wafers mean that overlay and critical dimension budgets shrink with shrinking ground rules and the semiconductor manufacturing processes are becoming more aggressive. Non-limiting examples of such aggressive semiconductor manufacturing processes include, but are not limited to, multiple patterning, and high aspect ratio etching or deposition of exotic materials on a surface of the semiconductor wafer. The non-uniformity of some of the semiconductor manufacturing processes over the semiconductor wafer surface and a plurality of semiconductor manufacturing process steps may result in non-uniform stress being applied to the semiconductor wafer.

One example of the issue that occurs is the so-called overlay error. This can occur when the semiconductor wafer deforms from one process step to a subsequent process step, e.g. from one lower layer to a subsequent layer on top of the lower layer, patterns in the upper layer become misaligned with respect to patterns in the lower layer. For the error free functioning of the semiconductor device, the relative position of the patterns on the different layers to each other is relevant. The reason for this misalignment can be multi-fold and may depend on the different process steps. It is therefore an aim of the method and apparatus described in this document to enable the evaluation and control of the semiconductor manufacturing process to identify and/or correct for such issues in the semiconductor manufacturing process. This evaluation and control is done by associating a plurality of data items with the process flow and then analysing the combination of the data items and the process flow.

A further issue that arises using the aggressive semiconductor manufacturing processes concerns the so-called critical dimensions (CDs). This term is used to indicate the geometrical dimensions of features of critical patterns on the surface of the semiconductor wafer. These features are measured after processing, such as the patterning of the lithographic layer, deposition or etching, etc., in order to verify the quality of the process steps, such as exposure and development process, by comparing the actual values to the target values and by determining the uniformity over the field, the semiconductor wafer and the lot.

In practice, there are multiple measurements, which need to be considered when deciding whether the semiconductor devices manufactured on the semiconductor wafer are likely to perform according to specifications. The use of the overlay measurements and CD measurements is merely used as an illustration.

The need to collect data documenting a semiconductor manufacturing process is known. For example, U.S. Pat. No. 8,396,583 (TSMC) teaches a method for fabricating a semiconductor device which includes collecting a plurality of manufacturing data sets. The manufacturing data sets are normalised and then used to predict the performance of one of the semiconductor manufacturing processes.

An older U.S. Pat. No. 5,866,437 (AMD) teaches a method of manufacturing semiconductor wafers using a simulation tool to determine predicted wafer electrical test measurements based on comparisons of measurements of the critical dimensions with historic data.

U.S. Pat. No. 7,646,476 teaches a method of detecting process excursions based on the analysis of defect information of a semiconductor substrate.

None of these prior art publications teach the association of measurements of process step parameters with a process step, as part of the process flow, to enable the evaluation and control of the semiconductor manufacturing process.

SUMMARY OF THE INVENTION

A method of evaluating and controlling a semiconductor manufacturing process having a plurality of process steps is disclosed. The method comprises retrieving process step parameters from a process measurement database, wherein the process step parameters comprise at least one of process step measurement data, process step context data or process step control data, and associating the process step parameters with one or more of the process steps as part of the process flow. The association of the process step parameters enables an operator to be better able to evaluate the process flow of the semiconductor manufacturing process, to rework layers that can be re-worked, and apply feedback or feed-forward modifications to the process steps of the semiconducting manufacturing process, as required.

The process step measurement data comprises at least one of an overlay measurement, a critical dimension measurement, an alignment measurement, a levelling measurement, an exposure dose, an etching measurement or a deposition measurement.

The process step context data comprises at least one of a lot identifier, exposure date, exposure recipe, process chamber identifier, a processing tool identifier or processing time, semiconductor wafer identifier, recipe name or type, reticle name, layer name, product or technology name, resist name, resists batch identifier, developer identifier, developer batch identifier, hot plate number, development chamber, rinse fluid name.

The process step control data comprises at least one of process recipe steering parameters, target parameters, reference corrections, field fine correction, wafer grid corrections, focus corrections, exposure dose corrections, etch time, deposition, gas flow rate and sputtering voltage.

A semiconductor fabrication assembly for a semiconductor manufacturing process having a plurality of process steps is also disclosed. The semiconductor fabrication assembly comprises an exposure tool, a developing unit, an etch chamber, a deposition chamber, a processor, and a process step measurement database collecting measurements of process step parameters from at least one of the exposure tool, the developing unit, the etch chamber and/or deposition chamber. The processor in operation retrieves the process step parameters from the process step measurement database, the process step parameters comprising at least one of process step measurement data, process step context data or process step control data; and associates the process step parameters with one or more of the process steps.

DESCRIPTION OF THE DRAWINGS

For a more complete understanding of the present invention and the advantages thereof, reference is now made to the following description and the accompanying drawings, in which.

DETAILED DESCRIPTION OF THE INVENTION

The invention will now be described on the basis of the drawings. It will be understood that the embodiments and aspects of the invention described herein are only examples and do not limit the protective scope of the claims in any way. The invention is defined by the claims and their equivalents. It will be understood that features of one aspect or embodiment of the invention can be combined with a feature of a different aspect or aspects and/or embodiments of the invention.

Figure 1:
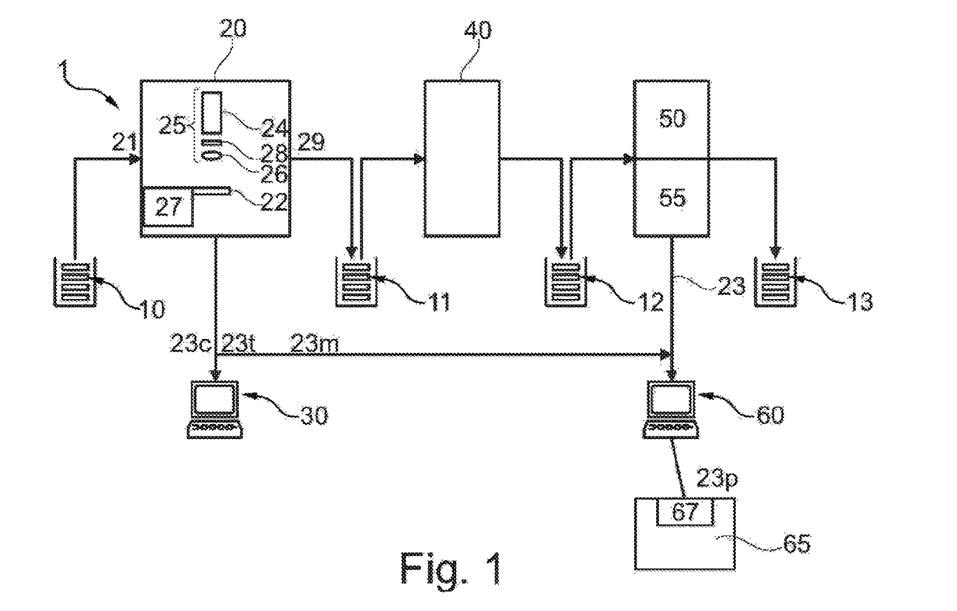
FIG. 1 shows a simplified overview of a semiconductor fabrication assembly of the present disclosure.

FIG. 1 shows in a schematic view a fabrication assembly 1 for carrying out a number of process steps of the semiconductor manufacturing process, such as but not limited to patterning a surface of a semiconductor wafer 10 including etching and/or deposition. The fabrication assembly 1 is connected to a processor 60 which is used to perform the method of this disclosure, as will be described later. The processor 60 is shown in this example as a single unit, but may of course be a plurality of units or otherwise a distributed network, as discussed below. It will be appreciated that the fabrication assembly 1 shown in FIG. 1 is merely illustrative and that, in practice, a real-life semiconductor manufacturing process requires significantly more elements.

It will be appreciated that the fabrication assembly 1 forms part of a semiconductor manufacturing system. The fabrication assembly 1 comprises a coater (not shown) for spinning resist on the surface of the semiconductor wafer 10 and an exposure tool 20 for aligning and exposing portions of the surface of the semiconductor wafers 10 to produce exposed semiconductor wafers 11, an exposure controller 30, a developing unit 40 for developing the exposed semiconductor wafers 11 to produce developed and exposed semiconductor wafers 12, an etch chamber 50 to etch the developed and exposed semiconductor wafers 12 in order to form structures on the semiconductor wafer 10, and/or a deposition chamber 55 for depositing new layers on the surface of the developed and exposed semiconductor wafers 12. The etch chamber 50 and the deposition chamber 55 are shown in FIG. 1 as a single unit for simplicity. This fabrication assembly 1 results in a processed semiconductor wafer 13. It is also possible for the deposition chamber 55 to be placed before the exposure tool 20 in the fabrication assembly 10. In this case the process flow will be modified such that the deposition of the new layers will be carried out before the etching of the material, i.e. parts of the new layers.

It will be appreciated that the fabrication assembly 1 will include a number of sensors 27 in one or more of the exposure tool 20, developing unit 40 and/or the etch chamber 50 or the deposition chamber 55. These number of sensors 27 are shown for the exposure tool schematically as a single sensor unit 27. Measurements can be taken both before and after deposition and/or etching on any of the exposed and developed semiconductor wafers 12.

It will also be appreciated that the fabrication assembly 1 has more than one etch chamber 50 or deposition chamber 55 to increase throughput of the semiconductor manufacturing process. It will be noted that the fabrication assembly 1 may include tools from a variety of manufacturers.

The fabrication assembly 1 can use, in addition to optical semiconductor lithography tools with masks, other methods to produce patterns to form structures on the semiconductor wafer. Other non-limiting methods include the use of electron beams to produce patterns in the resist or the use of imprint lithography techniques.

It will also be understood that there are one or more measuring tools integrated into the fabrication assembly 1. The one or more measuring tools are able to measure one or more physical or electrical parameters of the semiconductor wafers 10 after the completion of one or more of the process steps. It will be noted that not all of the semiconductor wafers 10 are measured, but that only a selection of the semiconductor wafers 10 will be measured. Similarly, not all of the exposed and developed semiconductor wafers 12 and the processed semiconductor wafers 13 will be measured.

The fabrication assembly 1 also includes the processor 60, shown here as a stand-alone computer, but which could be running as a software module on a server, in a cloud computer or on a local computer. It was noted above that there may be more than one processor 60 and that a single processor is shown in FIG. 1 for simplicity. The processor 60 is able to access a process measurement database stored in a storage memory 65 for storage of data relating to the semiconductor manufacturing process.

The process measurement database 65 would be typically a relational database accessed by, for example, an access program running on the processor 60. This data in the relational database includes, but is not limited to, process step measurement data 23m, process step context data 23t and process step control data 23c. The items of data are stored in tables and can be used in the method of this application to be associated with one or more process steps in the process flow.

The process step measurement data 23m are electrical data or physical measurements carried out on the semiconductor wafer 10 (or on one or more of the exposed and developed semiconductor wafers 12, or the processed semiconductor wafer 13). In a non-limiting example, the process step measurement data 23m comprises at least one of an overlay measurement, a critical dimension measurement, an alignment measurement, a leveling measurement, an exposure dose, an etching measurement or a deposition measurement.

Non-limiting examples of the overlay measurements include the position of the overlay marks, the measurement orientation of the overlay marks, dispositioning values between two layers and quality parameters.

Non limiting examples of critical dimension measurements include the position of the features as well as the geometrical data of the features and derived data, such as the line edge roughness or line width roughness.

Non-limiting examples of etching measurements include etch depth. Non-limiting examples of deposition parameters include deposition thickness.

Non-limiting examples of alignment measurement include the position of the alignment marks, the direction of the alignment marks, the dispositioning values and quality parameters.

Non-limiting examples of levelling measurement include the bare heights, the static and dynamic residuals.

The process step context data $23t$ are items of data relating to the process steps of the semiconductor manufacturing process. In a non-limiting example, the process step context data $23t$ comprises at least one of a lot identifier, wafer identifier, exposure date, exposure recipe, type of resist and developer, including batch number, process chamber identifier, a processing tool identifier, processing time, semiconductor wafer identifier, recipe name or type, reticle identifier, layer name, product or technology name, resist name, resist batch identifier, developer name, developer batch identifier, hot plate identifier, development chamber, rinse fluid name or data file name.

The process step control data $23c$ is that data relating to the processing tools, such as the exposure tool 20, the developing unit 40, the etch chamber 50 and/or the deposition chamber 55. The process step control data $23c$ can be obtained from, for example, the manufacturing execution system or the advanced process control (APC) systems. In a non-limiting example, the process step control data $23c$ comprises at least one of process recipe steering parameters, target parameters including reference corrections, field fine corrections, wafer grid corrections and focus corrections and exposure dose corrections for the exposure tool 20, deposition time, gas flow rate and sputtering voltage for the deposition chamber 55 or etch times for the etch chamber 50. The process step control data $23c$ can be static or constant, i.e. unvarying during at least part of the semiconductor manufacturing process, or the process step control data $23c$ can be dynamically modified depending on feedback/feed-forward received during the execution of the process steps.

Some of the items of the process step control data $23c$ and the process step measurement data $23m$ from the processing tools can be obtained by polling from one or more of the processing tools or measurement tools in the fabrication assembly 1. Other items can be obtained from the management execution system. Alternatively, transfer of the data to the process measurement database 60 could be triggered by specific events in the semiconductor manufacturing process flow. The items of the process step control data $23c$ are transferred, for example, using the SECS/GEM protocol defined for interfacing with the processing tools or the measurement tools. The items of data are transferred using, for example, web services, a TCP/IP protocol or an RS-232 protocol.

Let us suppose that a plurality of semiconductor wafers 10 is loaded into the exposure tool 20. The semiconductor wafers 10 loaded into the exposure tool 20 have been coated in one non-limiting aspect of the method with a photoresist film in a preceding process step. The exposure tool 20 includes a load port 21 for loading the semiconductor wafers 10 and an unload port 29 for unloading exposed ones of the semiconductor wafers 11. The load port 21 and the unload port 29 could be identical in the exposure tools 20. Within the exposure tool 20, the semiconductor wafers 10 are placed on a substrate holder 22.

A typical one of the semiconductor wafers 10 comprises a plurality of exposure fields arranged on the semiconductor wafer 10 in a grid-like pattern or in an offset/staggered pattern. The plurality of exposure fields is usually exposed one exposure field after another exposure field after resist has been spun onto the surface of the semiconductor wafer 10. The substrate holder 22 is positioned by actuators (not shown) within the exposure device 20 at least in two dimensions to move the semiconductor wafer 10. Thus each one of the exposure fields on the semiconductor wafer 10 is positioned in turn using a projection system 25. The projection system 25 comprises a light source 24 and projection optics 26, which function with a photo mask 28. The semiconductor wafer 10 includes, for example, alignment marks (see FIG. 3) that are used by the exposure tool 20 to align the surface of the semiconductor wafer 10 with the light source 24 and the projection optics 26 to ensure that the correct exposure field with the correct settings is illuminated. Items of the process step parameters 23 from the alignment of the semiconductor wafer 10 as well as other ones of the process step parameters 23 are generated by the exposure device 20 and these process step parameters 23 are transferred to the processor 60. The exposure device 20 includes a plurality of measurement sensors 27 to measure further items of the process step parameters 23, including the process step measurement data $23m$ and can be further modelled, as described later.

Each time the semiconductor wafer 10, the photo mask 28 and the projection system 24, 26 have been aligned, the photo mask 28 is illuminated with the light source 24 and the pattern from the photo mask 28 is projected in a single shot or scanned on an individual exposure field. The pattern on the photo mask 28 is used to generate one or more patterns on the surface of the semiconductor wafer 10 as well as the overlay marks.

The exposed semiconductor wafer 11 is passed to the developing unit 40 where the photoresist layer on the exposed semiconductor wafer 11 is developed and resist removed from the surface of the exposed semiconductor wafer 11 to produce an exposed and developed semiconductor wafer 12. The exposed and developed semiconductor wafer 12 is passed to the etch chamber 50 in which a structure is etched into the topmost layer of the exposed and developed semiconductor wafer 12 or to the deposition chamber 55 in which a layer of material is deposited on to the surface of the exposed and developed semiconductor wafer 12. After etching or deposition, any remaining resist (or surplus deposited material) on the exposed and developed semiconductor wafer 12 is removed and the processed wafer 13 is produced. The exposed and developed semiconductor wafer 12 could also be passed after etching from the etch chamber 50 to the deposition chamber 55 to deposit a new layer of material onto the surface or vice versa. The final processed chips are completed after all of the layers have been deposited and etched or otherwise processed.

The overlay marks are used to measure the overlay of the exposed and developed semiconductor wafers 12. The overlay measurement includes determining the disposition of the photoresist pattern with respect to the lower layers, e.g. determine whether there is a good value of the overlay or whether the overlay error is large. In case the disposition of the photoresist pattern is so large that, for example, features created in the resist layer fail to align correctly with selected features in the layers underneath, then this misalignment of the features in a region of the semiconductor wafer might cause a failure of one or more of the microelectronic devices of the final semiconductor chips in the same region. Should a significant error occur, the photoresist film with the photoresist pattern can be removed before etching or deposition of further layers from the upper surface of the exposed and developed semiconductor wafer 12. In this case, the exposed and developed semiconductor wafer 12 can be reworked by removal of the photoresist film and coating with a new photoresist film. The new photoresist film can be exposed again in the exposure tool 20 to create a new photoresist pattern.

The overlay measurements can also be used to calculate, if necessary, process correction parameters based on a process model 67, which are then used to compensate for process errors (as noted briefly above). The overlay measurements are examples of the process step measurement data 23$m$ which is stored in the process measurement database 65 and can be used in the process model 67.

It will be appreciated that the measurement of overlay and critical dimensions are only non-limiting examples of the analysis of the process step measurement data 23$m$. Other items of the process measurement data 23$m$ can be obtained from a variety of sources, for example, in the exposure tool 20, the developing unit 40, the deposition chamber 55 and the etch chamber 50. These items of the process step measurement data 23$m$ in addition to the items noted above include, but are not limited to, overlay errors, critical dimensions, alignment measurements, leveling measurements, deposition thickness, etching depths, line edge roughness (LER), line width roughness (LWR), side wall angle, other geometry data of patterns, wafer shape and/or deformation, temperature of hot plates, defect measurements, exposure dose, focus/exposure dose measurements, or electrical measurements.

In an ideal world, a large number of measurements would be made of the process step measurement data 23$m$. This is, however, time-consuming and, in most cases, not necessary as many values of the items of the process step measurement data 23$m$ remain substantially unchanged over time and/or over the whole of the semiconductor wafer 10 or the lot, or indeed of the wafers processed on one wafer table or in one etch chamber 50 or one deposition chamber 55.

It is not necessary to measure the process step measurement data 23$m$ for every single one of the semiconductor wafers 10 or every single one of the exposure fields on the same semiconductor wafer 10. Measured items of the process step measurement data 23$m$ for a subset of the exposed and developed semiconductor wafers 12 can be used to model the process using so-called process models 67. A typical subset for a lot of twenty-five exposed and developed semiconductor wafers 12, for example, could comprise four of the exposed and developed semiconductor wafers 12. The number of exposed and developed semiconductor wafers 12 picked for measurement is user configurable and depends on a selection strategy decided by quality control engineers and the evaluation process of these descriptions enable the quality control engineers to select the most relevant wafers.

Obviously, the larger the number of samples of the exposed and developed semiconductor wafers 12 that are chosen the more statistically reliable the modelled process data will be. If the statistical variations of the semiconductor manufacturing process are relatively low, a smaller number of samples of the exposed and developed semiconductor wafers 12 will suffice to obtain sufficiently reliable estimations by using the process models 67.

The process model 67 uses the one or more items of the process step measurement data 23$m$ to model the process and can generate further items of the post-process data 23$p$, which can be used to analyse the process. The process model 67 can also be used to calculate so-called residuals, which is the difference between the post-process data 23$p$ calculated from the process model 67 and the actually measured values of the process step measurement data 23$m$.

It will be appreciated that, it is not necessary to make measurements on all of the exposure fields. It will generally suffice to make measurements on selected ones of the exposure fields to obtain statistically reliable measurements. If the statistical variations increase, the number of selected ones of the exposed and developed semiconductor wafers 12 should be increased accordingly in order to produce statistically more significant further items of the post-process data 23$p$.

Figure 2:
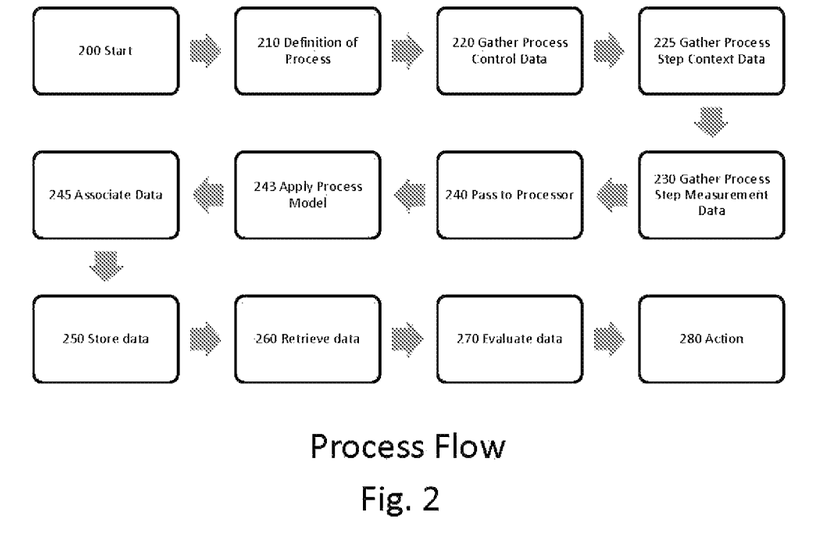
FIG. 2 shows an overview of an embodiment for the evaluation and control method of the current disclosure.

An exemplary method for analysis of evaluating the semiconductor manufacturing process of the semiconductor wafer 10 is shown in outline in FIG. 2. It will be appreciated that the method is not strictly sequential as suggested by FIG. 2, but that several of the steps happen at the same time or in a different order. The method starts in step 200. In a first step 210, the semiconductor manufacturing process is defined. This definition can be manually entered into the process controller 60 or can be determined from the process flow defined in the manufacturing execution system (MES) or advanced process control (APC) system using the processing tools, such as the exposure tool 20, the developing unit 40, the etch chamber 50, etc., or it can be constructed for a certain lot implicitly from the sequence of incoming process measurement data 23$m$ using the time stamps. It will be appreciated that this definition could be different for different ones of the lots, even if the definition relates to the same product and/or technology. This definition is stored in the process measurement database 65.

The items of the process step measurement data 23$m$ and, if applicable, any associated process step control data 23$c$ are gathered during or after the process steps and will be linked to the process step. The items of the process step control data 23$c$ are gathered in step 220 and include the process step control data.

The items of the process step context data 23$t$ are gathered in step 225 and the items of the process step measurement data 23$m$ are gathered in step 230. Further items of the semiconductor process step measurement data 23$m$ can be obtained from other equipment and tools used during and after the manufacturing process and not illustrated in FIG. 1. The process step context data 23$t$, the process step control data 23$c$ and the process step measurement data 23$m$ as well as the further items of the post-process data 23$p$ generated from the process model 67 are stored in the process measurement database 65, as represented by the step 250 later in the flow diagram.

The process step measurement data 23$m$, the process step control data 23$c$ and the process step context data 23$t$ are passed continually or in batches to the processor 60 in step 240. The processor 60 can in step 243 apply the process model 67 to one or more items of the process step measurement data 23$m$, as explained previously. The process model 67 retrieves the process step measurement data 23$m$ from the process measurement database 65 and can write its calculations results into the process measurement database 65.

The processor 60 associates the process step measurement data 23m (as well as the further items of post-process data 23p generated from the process model 67), the process step control data 23c and the process step context data 23t to one or more of the process steps in step 245 and stores the process step measurement data 23m, the process step control data 23c and the process step context data 23t as well as the further items of post process data 23p generated from the process model 67 in the process measurement database 65 in step 250. It will be appreciated that the storage step 250 will in fact take place during gathering of the process step measurement data 23m. The association is done for example by either pre-programming the processor 60 to make the association or by making the association on the basis of the file name of the process step measurement data 23m and/or the process step control data 23c. Further, items of data in the process step control data 23c, which are received together with the process step measurement data 23m and/or the process step control data 23t, can be used to make the association of the data with the process step.

The processor 60 can retrieve the process step measurement data 23m, the process step control data 23c and the process step context data 23t from the process measurement database 65 in step 260 for carrying out evaluations in step 270. The processor 60 may also include the process model 67 into which the gathered process step measurement data 23m is input and then modelled. The process step measurement data 23m then includes also the further items of the post-process data 23p derived from the process model 67.

After carrying out the evaluation step 270, then it is possible to carry out a number of actions in step 280. For example, it would be possible to re-work one of the layers of the exposed and developed semiconductor wafer 12 or use only part of the final semiconductor wafer chip as the rest of the electronic devices are likely to be out of specification. The evaluation can also enable one or more of the process steps to be modified using feed forward or feedback corrections.

EXAMPLES

Example: Indirect Overlay Measurement

Figure 3:
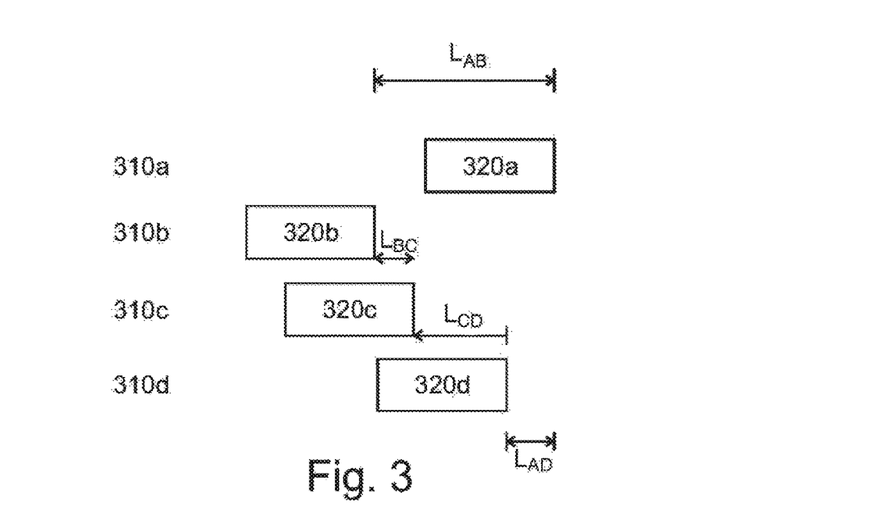
FIG. 3 shows an example of overlay measurement for structures on several ones of semiconductor layers.

FIG. 3 shows an example of a plurality of layers of a partially exposed and developed semiconductor wafer 300. For reasons of simplicity, only four layers 310a-d are shown on the semiconductor wafer. In this example, there are four structures 320a-d arranged on different layers and which are substantially arranged above each other. Two or more of the four layers 310a-d have overlay marks, which enable the overlay between some of the four structures 320a-d to be measured, but it is not possible to measure the overlay between first (topmost) one 320a of the four structures and the second one 320b of the four structures. This could be because there are no overlay marks to measure the dispositioning between the first structure 320a and the second structure 320b directly.

In the example shown in FIG. 3, however, it is possible to measure the overlay between the second structure 320b and the third structure 320c, between the third structure 320c and the fourth (bottommost) structure 320d as well as between the first (topmost) structure 320a and the fourth (bottommost) structure 320d. These overlay measurements are carried out at the same area and stored in the process measurement database 65 together with the process step parameters 23. The process step parameters 23 comprise in this example the process step measurement data 23m as well as the process step context data 23t. In this case, the process step context data 23t will include the wafer identifiers, the lot identifier and the layer numbers.

The processor 60 will be able to calculate the overlay between the first structure 320a and the second structure 320b from the stored process step parameters 23 in the process measurement database 65. The processor 60 will use the stored overlay measurements as well as knowledge of the process flow to make this calculation. In the simplest version shown in FIG. 3, the calculated overlay measurement $L_{ab}$ between the first structure 320a and the second structure 320b will be:

$$L_{ab} = L_{ad} - L_{bc} - L_{cd}$$

in which $L_{ab}$ is the overlay between the topmost first structure 320a and the second structure 220b, $L_{bc}$ is the overlay between the second structure 320b and the third structure 320c, $L_{cd}$ is the overlay between the third structure 220c and the bottommost fourth structure 320d and $L_{ad}$ is the overlay between the topmost first structure 320a and the bottommost fourth structure 320d.

Example: Significance Analysis

Figure 4:
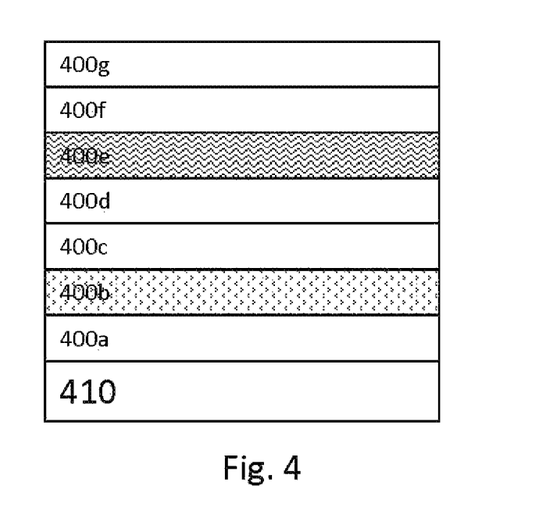
FIG. 4 shows a plurality of layers on a semiconductor substrate.

A further example of the use of the method is shown in FIG. 4 in which there are a plurality of layers 400a-g on a semiconductor substrate 410. Again this is a simplified example of the semiconductor device, which in real life would have many more layers and would also include structural features that are not shown on this figure. Let us suppose that certain ones of the semiconductor wafers 10 are found to have areas in which electric measurements indicate that microelectronic devices in these areas are out of specification.

The process measurement database 65 includes the process step control data 23c and thus it is possible to determine whether there are any similarities in the semiconductor manufacturing process flow, which might give rise to similar errors at a particular location, e.g. at the wafer edge, with the out of specification microelectronic devices. It might be found, for example, that the etching steps in the second layer 400b and the fifth layer 400e, which form part of the out of specification microelectronic device, are commonly carried out in a particular etch chamber 50, whereas the other ones of the semiconductor wafers had not been processed in this particular etch chamber 50. This information can be used to test more extensively the processed semiconductor wafers 13 having passed through the particular etch chamber 50. The use of the process step context data 23c will enable an understanding to be made whether the issue is related to the outcome of the process step, i.e. the extent to which other ones of the process steps will influence the errors. Furthermore, it is possible to use the results to adapt the processing conditions in the etch chamber 50 or use the information to change the conditions of the exposure step in a previous process step (feedback), since the relevant process step parameters 23 are stored in the process measurement database 65.

Example: Excursion Detection

A further application of the method is the evaluation of so-called excursion detections in which some of the measured items of the process step measurement data 23m deviate from expected values of the rest of the items of the process step measurement data 23m. This can be illustrated by reference to an exposure step. As discussed above, the exposure tool 20 provides process step measurement data 23m concerning—amongst other items—the exposure fields and alignment for process steps carried out in the exposure tool 20, such as spinning of resist, exposure, and developing.

The method of this disclosure enables the process step measurement data 23m to be examined for each one of the exposed and developed semiconductor wafers 12 and the excursions in the process step measurement data 23m to be detected and the corresponding process steps to be identified. For example, the alignment data can be used to detect grid distortion defects by identifying such excursions.

The method then enables correction measures to be made to the semiconductor manufacturing process. These correction methods could mean a re-work of the affected layer, or carrying out detailed electrical or physical measurements on devices manufactured on a section of the processed semiconductor wafer 13, as noted below.

In another aspect, it is possible to use the method and arrangement to review any issues that might arise at the edges of the semiconductor wafer 10 and to determine in which one of the process steps the issue arose.

The example has been discussed with respect to a lithographic exposure step, but other process steps that could be reviewed using this method include, but are not limited to, etching steps, deposition and chemical-mechanical planarization.

This evaluation can also enable the process step to be altered so that the final semiconductor chips fall within specification by using feedback to alter the process step control data 23c for the exposure tool 20 for other ones of the semiconductor wafers 10. The evaluation enables other ones of the final semiconductor chips to be reviewed in more detail if the process step measurement data 23m stored in the process measurement database 65 indicates that the one or more of the process step was likely to result in a final semiconductor chip with problems, at least in some regions of the final semiconductor chip.

Example: Edge Placement Error

Figure 5A:
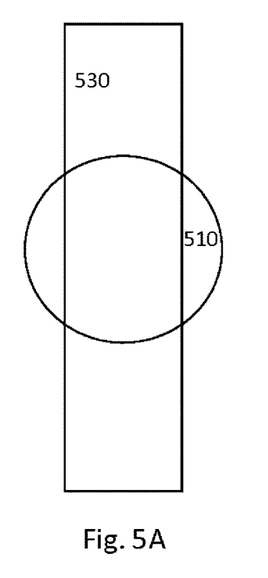
FIGS. 5A, 5B and 5C show various aspects of a connection of a contact with a metallisation line.
Figure 5B:
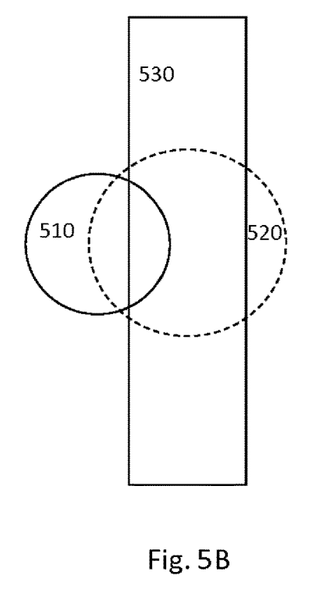
Figure 5C:
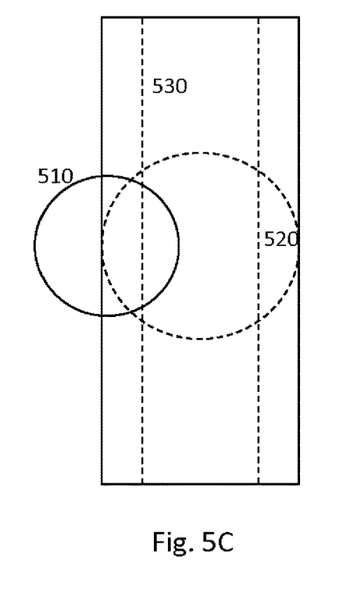

The method of disclosure can also be used to evaluate the process steps used in the manufacture of contacts 510 with a metallisation line 530, as seen in FIGS. 5A-C, and thus to determine and correct any edge placement error. FIG. 5A shows the ideal position and size in which the contact 510 directly contacts the metallisation line 530 and there is complete overlap between the contact 510 and the metallisation line 530. This is the ideal situation.

In FIGS. 5B and 5C, the dotted circle labelled 520 represents the ideal position of the contact 510 on the metallisation layer 530, as known in FIG. 5A. It will be seen that, in FIG. 5B, there is an overlay error of the contact 510 with respect to the ideal position 520 and thus also with the metallisation line 530. FIG. 5B also shows an error of the critical dimensions of the contact 510 (i.e. the contact 510 is too small). The area of overlap between the contact 510 and the metallisation line 530 is therefore too small to give an adequate electrical connection between the contact 510 and the metallisation line 530.

On the other hand, in FIG. 5C, the width of the metallisation line 530 is nominally too wide, i.e. the metallisation line 530 has a CD error, and the overlay error for the contact 510 with respect to the metallisation line 530 is identical with that of FIG. 5B, as the contact 510 has in this example no CD error. However, in the example of FIG. 5C, the area of overlap of the contact 510 and the metallisation line 530 is sufficient for a good electrical connection.

The method of this description allows the review of the process steps in the semiconductor manufacturing process leading to the edge placement error and the source of any such edge placement errors to be identified. In particular, the process steps for the structuring of the contact 510, and the structuring of the metallisation line 530, including the size and position of the contact 510 and the metallisation line 530, can be reviewed. The evaluation enables the identified process step(s) to be altered so that the final semiconductor chips fall within specification by using feed-back or feed-forward to modify the process step control data 23c for the exposure tool 20 in the manufacturing steps.

The evaluation may also allow a re-working of any layers if the evaluation shows that the pattern in the photoresist layer on the semiconductor wafer will produce the contacts 510 in an incorrect position or having an insufficient size.

The foregoing description of the preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments as are suited to the particular use contemplated. It is intended that the scope of the invention be defined by the claims appended hereto, and their equivalents. The entirety of each of the aforementioned documents is incorporated by reference herein.

REFERENCE NUMERALS

1 Fabrication assembly
10 Semiconductor wafer
11 Exposed semiconductor wafer
12 Exposed and developed semiconductor wafer
13 Processed semiconductor wafer
20 Exposure tool
21 Load port
22 Substrate holder
23 Process step parameters
23c Process step control data
23m Process step measurement data
23p Post-Process data
23t Process step context data
24 Light source
25 Projection system
26 Projection optics
27 Measurement sensor
28 Photo mask
29 Unload port
30 Exposure controller
40 Developing unit
50 Etch Chamber
55 Deposition Chamber
60 Processor
65 Process Measurement Database
67 Process models
310a-d Layers
320a-d Structures
400a-g Plurality of layers
410 Substrate 510 Contact
520 Ideal position
530 Metallisation Line

What is claimed is:

1. A method of evaluating and controlling a semiconductor manufacturing process of a semiconductor wafer comprising at least one layer, the semiconductor manufacturing process having a plurality of process steps in a process flow, the method comprising:
   gathering process step parameters during or after any one of a plurality of process steps in a process flow of a semiconductor manufacturing process of a semiconductor wafer, during which at least one layer of the semiconductor wafer is processed, wherein the process step parameters comprise at least one of
      process step measurement data from measurements carried out on the semiconductor wafer,
      process step context data relating to the process steps, and comprising at least a layer name of the at least one layer,
      process step control data relating to processing tools used in the semiconductor manufacturing process, and
      post-process data derived from the process step measurement data based on a process model;
   associating the process step parameters, and thereby at least the layer name of the at least one layer, to one or more of the plurality of the process steps in the process flow;
   evaluating the semiconductor manufacturing process based on the process step parameters, wherein the evaluating comprises identifying at least one of the plurality of process steps and the associated layer name of the at least one layer; and
   reworking, dependent on a result of the evaluating, the at least one layer of the semiconductor wafer, and/or modifying the process step control data.

2. The method of claim 1, wherein the process step measurement data comprises at least one of an alignment measurement, an overlay measurement, a levelling measurement, an exposure dose, a critical dimension measurement, an etching measurement or a deposition measurement.

3. The method of claim 1, wherein the process step context data further comprises at least one of a lot identifier, wafer identifier, exposure date, exposure recipe, type of resist and developer, including batch number, process chamber identifier, a processing tool identifier, processing time, semiconductor wafer identifier, recipe name or type, reticle identifier, product or technology name, resist name, resist batch identifier, developer name, developer batch identifier, hot plate identifier, development chamber, rinse fluid name or data file name.

4. The method of claim 1, wherein the process step control data comprises at least one of process recipe steering parameters, target parameters including exposure dose, reference corrections, field fine correction, wafer grid corrections, focus corrections, exposure corrections, etch time, deposition time, gas flow rate and sputtering voltage.

5. The method of claim 1, further comprising deriving further parameters from the associated process step parameters.

6. The method of claim 1, wherein the association of the process step parameters with the one or more process steps is carried out based on process context parameters.

7. The method of claim 1, further comprising applying at least one of a feed forward correction or a feedback modification to at least one of the process step control data based on the evaluation.

8. The method of claim 1, further comprising applying a process model to the associated process step parameters and the process steps.

9. Use of the method of claim 1 for evaluation of at least one of excursion detection, significance analysis, in direct overlay measurement or evaluation of edge placement errors.

10. A semiconductor fabrication assembly for a semiconductor manufacturing process of a semiconductor wafer comprising at least one layer, the semiconductor manufacturing process having a plurality of process steps, the semiconductor fabrication assembly comprising:
   an exposure tool;
   a developing unit;
   at least one of an etch chamber or a deposition chamber;
   a processor; and
   a process step measurement database collecting process parameters from at least one of the exposure tool, the developing unit, the deposition chamber and the etch chamber during or after any one of a plurality of process steps in a process flow of a semiconductor manufacturing process of a semiconductor wafer;
   wherein the processor in operation
   retrieves process step parameters from the process step measurement database, the process step parameters comprising at least one of
      process step measurement data from measurements carried out on the semiconductor wafer,
      post-process data derived from the process step measurement data based on a process model,
      process step context data relating to the process steps and comprising a layer name of the at least one layer, or
      process step control data relating to processing tools used in the semiconductor manufacturing process;
   associates the process step parameters, and thereby at least the layer name of the at least one layer, with one or more of the plurality of the process steps in the process flow;
   evaluates the semiconductor manufacturing process based on the process step parameters, wherein the evaluating comprises identifying at least one of the plurality of process steps and the associated layer name of the at least one layer, and
   controls, dependent on a result of the evaluation, reworking of at least one layer of the semiconductor wafer and/or modifying the process step control data associated to the identified at least one of the plurality of process steps.

* * * * *